United States Patent
Park et al.

(10) Patent No.: US 9,787,248 B2
(45) Date of Patent: Oct. 10, 2017

(54) POWER MEASUREMENT SYSTEM AND LOAD POWER MONITORING SYSTEM USING THE SAME AND OPERATING METHOD THEREOF

(71) Applicant: LSIS CO., LTD., Anyang-si, Gyeonggi-do (KR)

(72) Inventors: Hun Park, Gunpo-si (KR); Young Gyu Yu, Seoul (KR)

(73) Assignee: LSIS CO., LTD., Anyang-si (KR)

(*) Notice: Subject to any disclaimer, the term of this patent is extended or adjusted under 35 U.S.C. 154(b) by 7 days.

(21) Appl. No.: 14/963,051

(22) Filed: Dec. 8, 2015

(65) Prior Publication Data
US 2016/0294322 A1    Oct. 6, 2016

(30) Foreign Application Priority Data
Apr. 2, 2015    (KR) .................. 10-2015-0046812

(51) Int. Cl.
*G01R 19/00*    (2006.01)
*G01R 21/00*    (2006.01)
(Continued)

(52) U.S. Cl.
CPC ............ *H02S 50/00* (2013.01); *G01D 4/004* (2013.01); *G01R 21/133* (2013.01); *H02J 3/382* (2013.01);
(Continued)

(58) Field of Classification Search
CPC ....... G01R 21/133; G01D 4/004; H02J 3/382; H02S 50/00; Y02B 70/346; Y04S 20/38; Y04S 20/525
(Continued)

(56) References Cited

U.S. PATENT DOCUMENTS 8,527,129 B2 *    9/2013    Atluri ................. B60L 1/003
                                                180/65.1
8,744,640 B2    6/2014    Yonezawa et al.
(Continued)

FOREIGN PATENT DOCUMENTS

EP    2535727    12/2012
JP    2013-110944    6/2013
(Continued)

OTHER PUBLICATIONS

Japan Patent Office Application No. 2016-000893, Office Action dated Feb. 28, 2017, 3 pages.
(Continued)

*Primary Examiner* — Hoai-An D Nguyen
(74) *Attorney, Agent, or Firm* — Lee, Hong, Degerman, Kang & Waimey

(57) ABSTRACT

A load power monitoring system includes: an external power supply source; a renewable energy source configured to generate power or store a power applied from the external power supply source, and discharge the generated or stored power; a distribution board configured to distribute a power applied from the external power supply source or the renewable energy source to an electronic device; a power measurement device configured to detect power amount data of at least one of the external power supply source and the renewable energy source; a second power measurement device configured to detect power amount data distributed to the electronic device; and a monitoring server configured to collect power amount data detected by each of the power measurement devices and monitor a power of a load on the basis of the collected power amount data.

20 Claims, 16 Drawing Sheets

(51) Int. Cl.
*H02S 50/00* (2014.01)
*H02J 3/38* (2006.01)
*G01R 21/133* (2006.01)
*G01D 4/00* (2006.01)

(52) U.S. Cl.
CPC .......... *Y02B 70/346* (2013.01); *Y02B 90/242* (2013.01); *Y04S 20/322* (2013.01); *Y04S 20/38* (2013.01); *Y04S 20/525* (2013.01)

(58) Field of Classification Search
USPC ............................... 324/76.11; 702/1, 57, 60
See application file for complete search history.

(56) References Cited

U.S. PATENT DOCUMENTS

| | | | | |
|---|---|---|---|---|
| 8,812,164 | B2* | 8/2014 | Marchitto | F03D 9/00 |
| | | | | 700/276 |
| 9,428,067 | B2* | 8/2016 | Nakagawa | B60L 11/1809 |
| 9,564,756 | B2* | 2/2017 | Della Sera | H02J 3/38 |
| 2005/0001486 | A1* | 1/2005 | Schripsema | G01D 4/004 |
| | | | | 307/80 |
| 2012/0173034 | A1 | 7/2012 | Taima | |
| 2012/0310560 | A1* | 12/2012 | Ozaki | G01R 22/10 |
| | | | | 702/62 |
| 2014/0035376 | A1* | 2/2014 | Li | G06F 1/30 |
| | | | | 307/66 |
| 2014/0046495 | A1 | 2/2014 | Magnussen et al. | |
| 2014/0113828 | A1* | 4/2014 | Gilbert | H01L 39/126 |
| | | | | 505/100 |
| 2015/0137792 | A1 | 5/2015 | Filippi et al. | |
| 2016/0156188 | A1* | 6/2016 | Baba | G05B 15/02 |
| | | | | 700/296 |

FOREIGN PATENT DOCUMENTS

| | | |
|---|---|---|
| JP | 2013-255394 | 12/2013 |
| JP | 2014039352 | 2/2014 |
| JP | 2014-050171 | 3/2014 |
| JP | 2014-059244 | 4/2014 |
| JP | 5513819 | 6/2014 |
| JP | 2014-161173 | 9/2014 |
| KR | 10-2014-0048129 | 4/2014 |
| WO | 03017724 | 2/2003 |
| WO | 2014/001979 A1 | 1/2014 |
| WO | 2014141499 | 9/2014 |
| WO | 2015001979 | 1/2015 |
| WO | 2015004893 | 1/2015 |

OTHER PUBLICATIONS

European Patent Office Serial No. 16150171.3, Search Report dated Jul. 29, 2016, 7 pages.

Japan Patent Office Application No. 2016-000893, Office Action dated Jul. 28, 2017, 3 pages.

\* cited by examiner

POWER MEASUREMENT SYSTEM AND LOAD POWER MONITORING SYSTEM USING THE SAME AND OPERATING METHOD THEREOF

CROSS-REFERENCE TO RELATED APPLICATION

Pursuant to 35 U.S.C. §119(a), this application claims the benefit of earlier filing date and right of priority to Korean Patent Application No. 10-2015-0046812, filed on Apr. 2, 2015, the contents of which are all hereby incorporated by reference herein in its entirety.

BACKGROUND

The present disclosure relates to a power measurement system and a load power monitoring system using the same and an operating method thereof.

With the developments of digital and network technologies, home appliances and information appliances are also developed into forms with various functions depending on the fusion/complex of technology and such digital fusion/complex devices are widely used in each home and office. However, due to the fusion/complex of functions and the support of a network function, such information appliances consume power at a user's request but unlike a user's intent, standby power is consumed without user's recognition.

However, a user may not know which device consumes how much power for a specific period and thus may not feel the need for electrical energy savings.

In order to solve such an issue, in relation to an electronic device specific energy consumption monitoring function, there is a technique for analyzing and monitoring power consumptions and power consumption patterns as defining a specific period for each electronic device through a meter for measuring the total amount of power consumed for each home and building.

FIG. 1 is a block diagram of a typical load power monitoring system.

Referring to FIG. 1, in relation to the typical load power monitoring system, power supplied from an external power supply source 1 to each home 3 may be supplied to home appliances connected to an outlet through a distribution board 2 prepared at each home 3. Especially, the distribution board 2 includes a power measurement device 4 for checking how power supplied from the external power supply source 1 is used in home appliances in the home 3, for example, power's usage state and usage power.

The power measurement device 4 may execute individual monitoring through a server at a remote location by using the power usage and usage pattern information of home appliances.

According to a system and method for such typical load monitoring, it is impossible to detect power flowing from an electricity generation source or an energy source in addition to the external power supply source 1. Additionally, in order to detect additionally inflowing power, if a system is designed by adding a typical measurement device that requires high accuracy, excessive system design costs may be required and system volume increase according to a configuration of unnecessary devices may occur.

SUMMARY

Embodiments provide a power measurement system for supplying energy to a load by adding a renewable energy source in addition to a typical external power supply source and monitoring a consumption state for energy supplied to the load and a load power monitoring system using the same and an operating method thereof.

Embodiments also provide a load and a power measurement system for monitoring load power by configuring an effective system with a minimum cost in order to obtain power consumption amount and state for a load and power supply devices for the load and a load power monitoring system using the same and an operating method thereof.

Embodiments also provide a load, a power measurement system for monitoring load power by configuring an effective system with a minimum cost in order to obtain power consumption amount and state for a load and power supply devices for the load and a load power monitoring system using the same and an operating method thereof.

In one embodiment, a load power monitoring system includes: an external power supply source; a renewable energy source configured to generate power or store a power applied from the external power supply source, and discharge the generated or stored power; a distribution board configured to distribute a power applied from the external power supply source or the renewable energy source to an electronic device; a power measurement device configured to detect power amount data of at least one of the external power supply source and the renewable energy source; a second power measurement device configured to detect power amount data distributed to the electronic device; and a monitoring server configured to collect power amount data detected by each of the power measurement devices and monitor a power of a load on the basis of the collected power amount data.

In another embodiment, a load power monitoring method includes: collecting at least two power amount data among first power amount data flowing from an external power source, second power amount data applied to an electronic device, and power amount data of at least one renewable energy source; checking the collected power amount data; and estimating and checking uncollected power amount data on the basis of the collected power amount data.

The details of one or more embodiments are set forth in the accompanying drawings and the description below. Other features will be apparent from the description and drawings, and from the claims.

DETAILED DESCRIPTION OF THE EMBODIMENTS

Specific structural or functional explanations for embodiments according to the present invention which are disclosed in this specification or application are merely provided for the purpose of illustrating the embodiments according to the present invention. Thus, the embodiments according to the present invention may be implemented in various forms and are not construed as being limited to the embodiments described in this specification or application.

Accordingly, this s not intended to limit the embodiments according to the present invention as the specific disclosed forms; rather it should be understood that all of variations, equivalents or substitutes contained in the concept and technical scope of the present invention are also included.

Hereinafter, a power measurement device and a load power monitoring system using the same and an operating method thereof are descried with the accompanying drawings.

Figure 1:
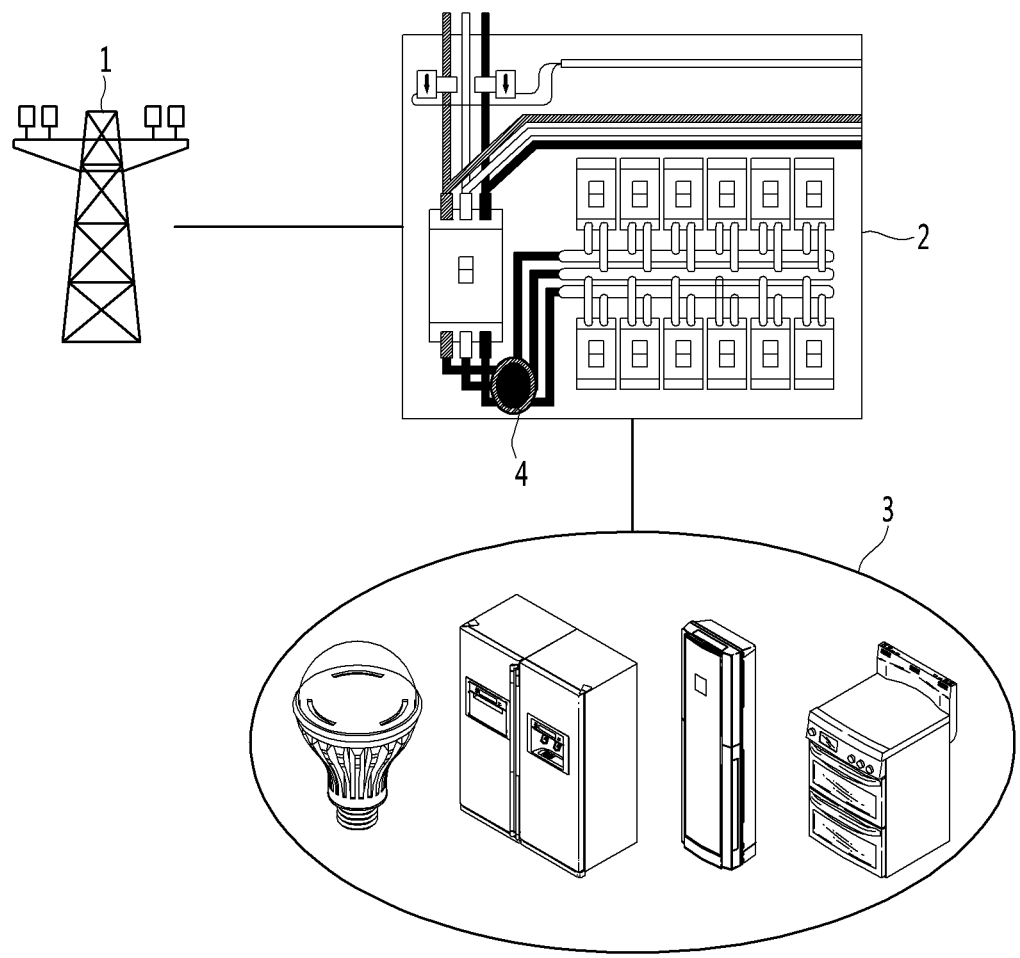
FIG. 1 is a block diagram of a typical load power monitoring system.
Figure 2:
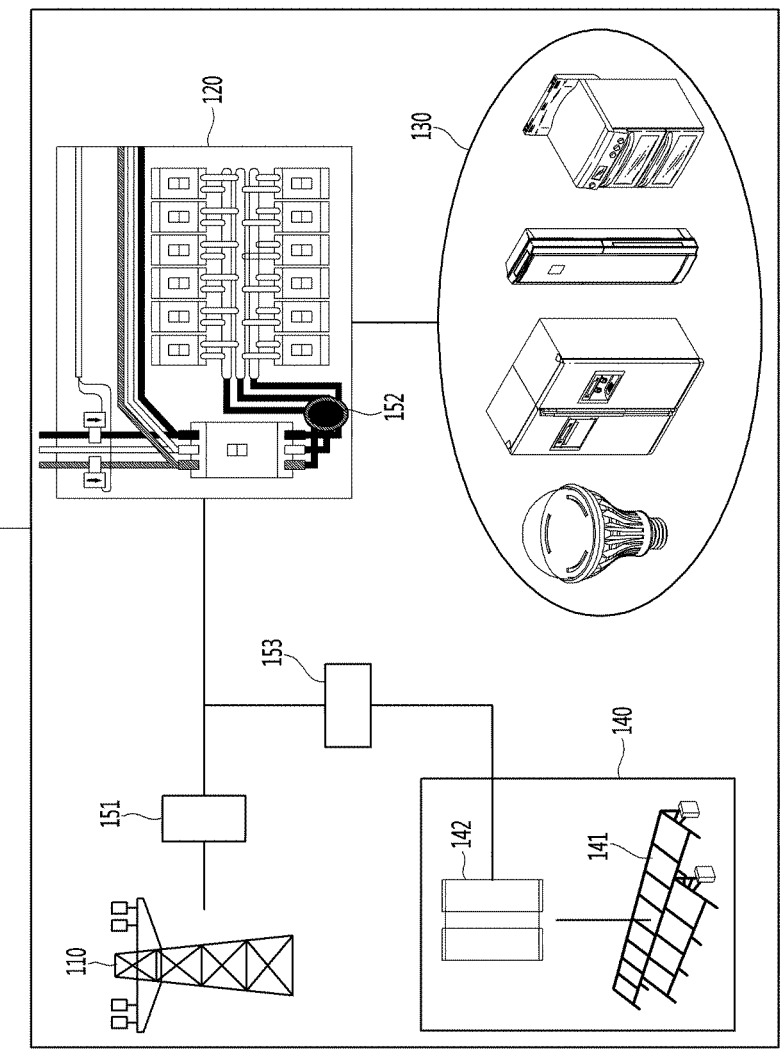
FIG. 2 is a block diagram illustrating a load power monitoring system according to an embodiment of the present invention.

FIG. 2 is a block diagram illustrating a load power monitoring system according to an embodiment of the present invention.

Referring to FIG. 2, a load power monitoring system according to an embodiment of the present invention includes a monitoring server 10, an external power supply source 110, a distribution board 120, an electronic device 130, and a solar electricity generation device 140. Especially, output terminals or input terminals of the external power supply source 110, the distribution board 120, and the solar electricity generation device 140 may be configured to include power measurement devices 151, 152, and 153 for detecting power amount data flowing or outputted to the devices.

According to an embodiment of the present invention, description is made limited to a solar electricity generation device as a renewable energy source but any renewable energy source for generating power may be applied. The monitoring server 10 may obtain power amount data including loads measured by the power measurement devices 151, 152, and 153 and the power consumption, inflow rate, or power consumption pattern of a power source. The power of a load may be monitored and outputted based on the obtained data.

Figure 14:
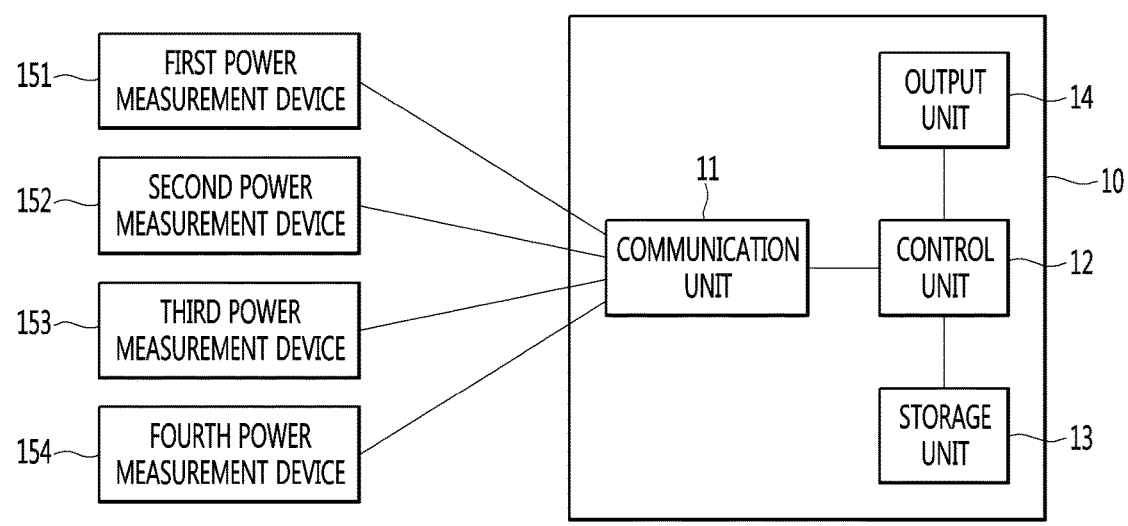
FIG. 14 is a block diagram illustrating a monitoring server according to an embodiment of the present invention.

FIG. 14 is a block diagram illustrating a monitoring server according to an embodiment of the present invention.

Referring to FIG. 14, the monitoring server 10 may be configured to include a communication unit 11, a control unit 12, a storage unit 13, and an output unit 14.

The communication unit 11 may include at least one module for allowing wireless or wired communication between the power measurement devices 151, 152, 153, and 154 and an external device.

The communication unit 11 may be configured in various forms, for example, a wireless internet module using Wireless LAN (WLAN) (for example, Wi-Fi), Wireless broadband (Wibro), World Interoperability for Microwave Access (Wimax), and High Speed Downlink Packet Access (HSDPA) and a short range communication module, and a wired communication module using Bluetooth, Radio Frequency Identification (RFID), infrared Data Association (IrDA), Ultra Wideband (UWB), and ZigBee. The communication unit 11 may receive power amount data from the power measurement devices 151, 152, 153, and 154.

The control unit 12 may check power amount data of the power measurement devices 151, 152, 153, and 154 received through the communication unit 11 and analyze it. The control unit 12 may extract and process data for power amount or power usage patterns according to the received power amount data of the power measurement device. As one example, in order to analyze the power usage patterns, a Non-intrusive Load Monitoring (NILM) algorithm may be executed. Additionally, the control unit 12 may perform a control to store power amount data and information on a corresponding power measurement device in the storage unit 13 or output them to the output unit 14.

The storage unit 13 may store power amount data received through the communication unit 11. The storage unit 13 may store an algorithm for power usage pattern analysis executed by the control unit 12. Examples of the storage unit 13 may include at least one type of storage medium among flash memory type, hard disk type, Solid State Disk (SSD) type, Silicon Disk Drive (SDD) type, multimedia card micro type, card type memory (for example, SD or XD memory type), random access memory (RAM) type, static random access memory (SRAM) type, read-only memory (ROM) type, electrically erasable programmable read-only memory (EEPROM) type, programmable read-only memory (PROM) type, magnetic memory type, magnetic disk type, and optical disk type.

The output unit 14 may output power amount data and analysis data, which are received from power measurement devices and processed, in various forms such as image and audio on the basis of a control of the control unit 12. Examples of the output unit 14 may include a display unit and a sound output unit.

Besides that, a user input unit (not shown) may be configured and the server 10 is controlled or the power amount data of monitored load may be outputted on the basis of an input of the user input unit.

A configuration for obtaining power amount data processed by the server 10 may include the external power supply source 110, the distribution board 120, the electronic device 130, and the solar electricity generation device 140.

The external power supply source 110, as an external power generation source such as a power plant, may supply inflowing power to various loads including the electronic device 130 in home through the distribution board 120.

The distribution board 120 may distribute power flowing from the external power supply source 110 or the solar electricity generation device 140 to be applied to various loads such as the electronic device 130 in home.

The solar electricity generation device 140 may be configured to include a solar module 141 and a control module 142. Solar energy incident to the solar module 141 of the solar electricity generation device 140 may be converted into AC power through the control module 140 and supplied to the distribution board 120. According to an embodiment of the present invention, a renewable energy source is described as one example of the solar electricity generation device 140. The present invention is not limited thereto and various devices for generating various renewable energies such as wind power and hydroelectric power may be configured.

Especially, the input terminals of the external power supply source 110 and the distribution board 120 and the output terminal of the solar electricity generation device 140 may be configured to connect to the power measurement devices 151, 152, and 153, respectively.

The first power measurement device 151 connected to the output terminal of the external power supply source 110 may be configured with at least one module for measuring a power amount supplied from the external power supply source 110.

Additionally, the second power measurement device 152 connected to the input terminal of the distribution board 120 may be configured with at least one module for measuring a power amount used in a load when supplying, to various loads such as the electronic device 130 in home, the power flowing from the external power supply source 110 or the solar electricity generation device 120. Especially, the second power measurement device 152 may measure the usage pattern of a power amount of a load in addition to the power consumption amount of a load. That is, the second power measurement device 152 may measure power amount data including operating state information and power consumption pattern information on a load in addition to the power consumption amount of a load Additionally, the third power measurement device 153 connected to the output terminal of the solar electricity generation device 140 may be configured with at least one module for measuring a power amount generated by the solar electricity generation device 140.

A load power monitoring method according to an embodiment of the present invention will be described in detail with reference to FIGS. 3 to 5 on the basis of a configuration of a load power monitoring system including the above power measurement device. Hereinafter, a monitoring method is described by limiting the order in which data is collected but data may be collected from each power measurement device regardless of the data collection order.

Figure 3:
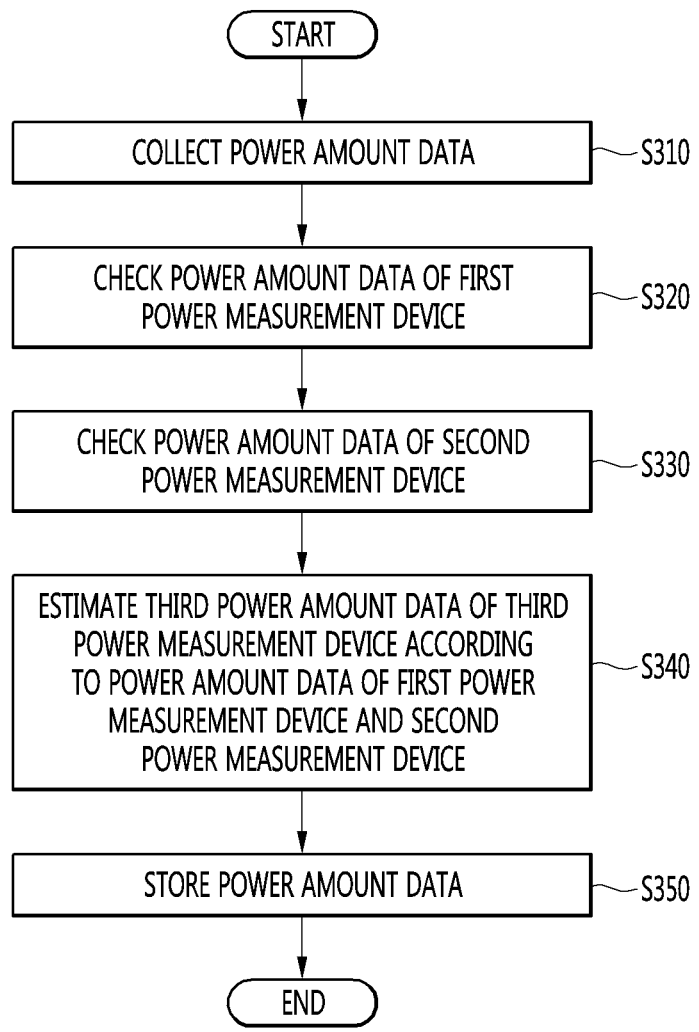
FIGS. 3, 4, and 5 are flowcharts illustrating load power monitoring operations of a load power monitoring system applied according to an embodiment of the present invention.
Figure 4:
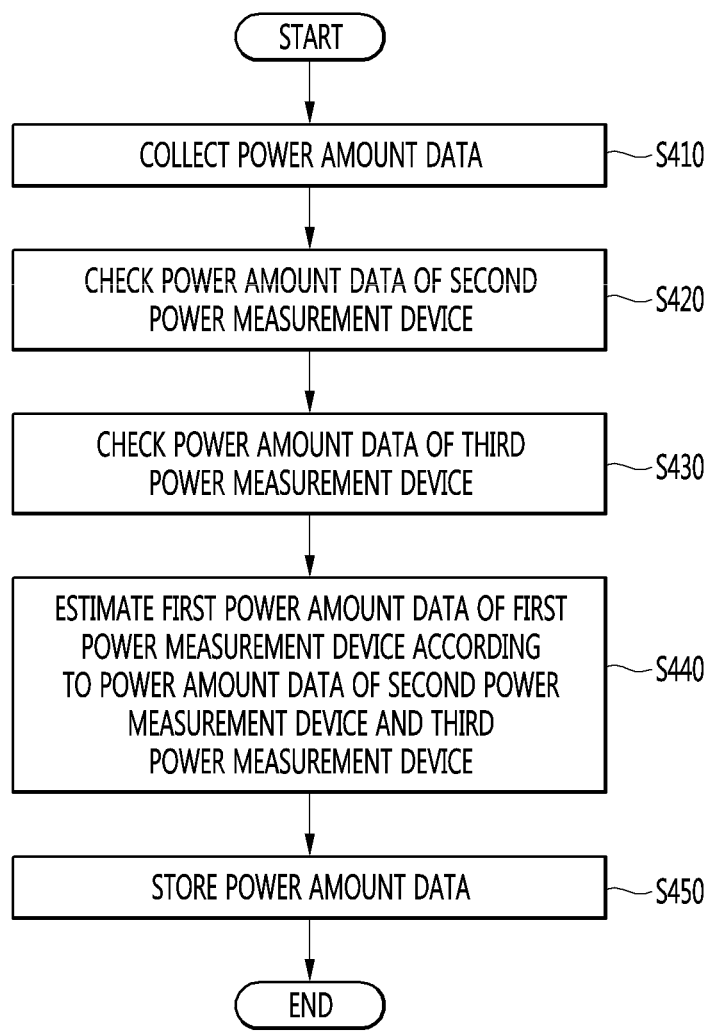
Figure 5:
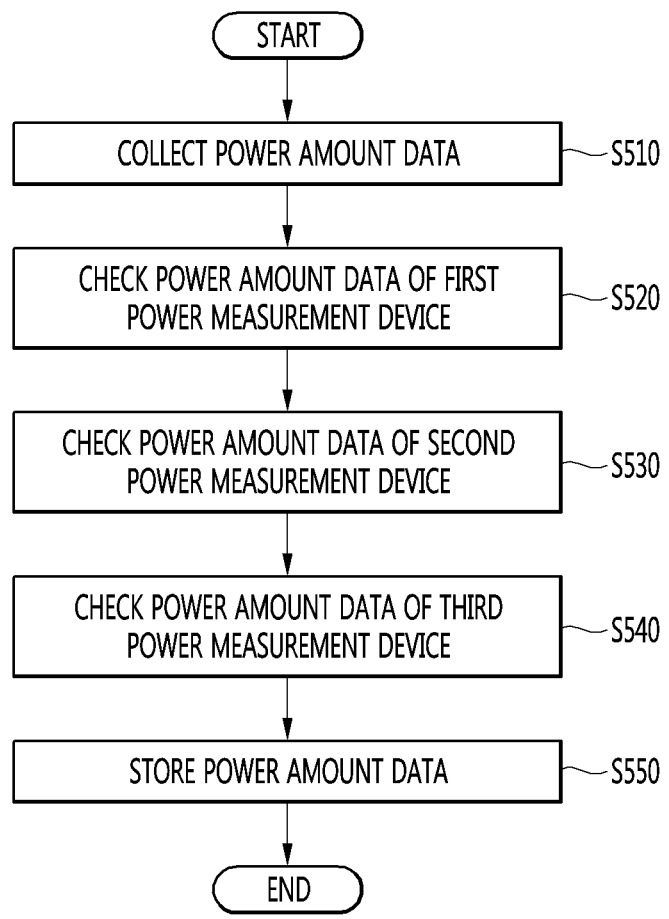

FIGS. 3 to 5 are flowcharts illustrating load power monitoring operations of a load power monitoring system applied according to an embodiment of the present invention.

FIG. 3 is an operation flowchart when the monitoring server 10 executes a load power monitoring operation according to a first embodiment of the present invention.

Referring to FIG. 3, the monitoring server 10 may collect power amount data from the power measurement devices 151, 152, and 153 through the communication unit 11 in operation S310. In more detail, the monitoring server 10 may collect power amount data measured and obtained by each of the first power measurement device 151 at the output terminal of the external power supply source 110, the second power measurement device 152 at the input terminal of the distribution board 120, and the third power measurement device 153 at the output terminal of the solar electricity generation device 140. That is, although it is described as an example that the third power measurement device 153 is configured at the output terminal of the solar electricity generation device 140, since the power amount data of the third power measurement device 153 is estimated by first power amount data and second power amount data, the third power measurement device 153 may not be included and configured according to a configuration embodiment of a system.

The control unit 12 of the monitoring server 10 may check power amount data of the first power measurement device 151 collected through the communication unit 11 in operation S320. The control unit 12 may check first power amount data including a power amount applied from the external power supply source 110.

When checking the power amount data of the first power measurement device 151, the control unit 12 of the monitoring server 10 may check second power amount data received from the second power measurement device 152 in operation S330. The control unit 12 may check second power amount data including information on the power usage amount pattern and the power consumption amount of the electronic device 130 to which power is supplied through the distribution board 120. At this point, information on a power usage amount pattern may be obtained through an NILM algorithm. The NILM algorithm may analyze a power amount consumed by each electronic device connected to the distribution board 120 and a power usage pattern, which are from a power measurement device connected to the distribution board 120.

When checking the power amount data of the second power measurement device 152, the control unit 12 of the monitoring server 10 may estimate and check the power amount data of the third power measurement device 153 on the basis of the power amount data of the first power measurement device 151 and the second power measurement device 152 in operation S340. In more detail, the control unit 12 may calculate the power amount data of the third power measurement device 153 by using a difference (−) of the first power amount data of the first power measurement device 151 and the second power amount data of the second power measurement device 152. That is, when a difference of the power amount (for example, the first power amount data) flowing from the external power supply source 110 and the power amount (for example, the second power amount data) consumed by the electronic device 130 is calculated through the distribution board 120, a power amount (for example, the third power amount data) generated by the solar electricity generation device 140 may be calculated.

As mentioned above, the control unit 12 may check power amount data including an inflow power amount and a power consumption amount of each of the first power measurement device 151 and the second power measurement device 152 and may estimate and check third power amount data including a generation amount for a renewable energy source such as the solar electricity generation device 140 on the basis of the checked power amount data. Additionally, the second poser measurement device 152 transmits the detected power amount data to the monitoring server 10 directly, so that the control unit 12 of the monitoring server 10 performs an analysis. Additionally, the second power measurement device 152 may analyze the usage pattern of a load on the basis of the detected power amount data and then may transmit the analyzed data to the monitoring server 10. In such a case, the monitoring server 10 may compare and analyze data collected from the first power measurement device 151 and the third power measurement device 153 and display it.

The control unit 12 may store the checked first power amount data, second power amount data, and third power amount data in the storage unit 13.

FIG. 4 is an operation flowchart when the monitoring server 10 executes a load power monitoring operation according to a second embodiment of the present invention.

Referring to FIG. 4, the monitoring server 10 may collect power amount data from the power measurement devices 151, 152, and 153 through the communication unit 11 in operation S410. In more detail, the monitoring server 10 may collect power amount data measured and obtained by each of the first power measurement device 151 at the output terminal of the external power supply source 110, the second power measurement device 152 at the input terminal of the distribution board 120, and the third power measurement device 153 at the output terminal of the solar electricity generation device 140. This embodiment may measure the uncollected first power amount data through the second power amount data and the third power amount data without collecting the power amount data of the first power measurement device 151. Accordingly, the first power measurement device 151 may not be configured for convenience of costs and installation.

The control unit 12 of the monitoring server 10 may check second power amount data received from the second power measurement device 152 in operation S420. The control unit 12 may check second power amount data including information on the power usage amount pattern and the power consumption amount of the electronic device 130 to which power is supplied through the distribution board 120. At this point, information on a power usage amount pattern may be obtained through an NILM algorithm.

When checking the power amount data of the second power measurement device 152, the control unit 12 of the monitoring server 10 may check third power amount data received from the third power measurement device 153 in operation S430. The control unit 12 may check third power amount data including a power amount generated by the solar electricity generation device 140.

The control unit 12 of the monitoring server 10 may estimate and check power amount data of the first power measurement device 151 on the basis of the checked power amount data of the second power measurement device 152 and the checked power amount data of the third power measurement device 153 in operation S440. In more detail, the control unit 12 may calculate the power amount data of the first power measurement device 151 by using a difference (−) of the third power amount data of the third power measurement device 153 and the second power amount data of the second power measurement device 152. That is, when a difference of the power amount (for example, the third power amount data) generated by the solar electricity generation device 140 and the power amount (for example, the first power amount data) consumed by the electronic device 130 is calculated through the distribution board 120, a power amount (for example, the first power amount data) flowing from the external power supply source 110 may be estimated and checked.

As mentioned above, the control unit 12 may check power amount data including a power consumption amount or a generation amount of each of the second power measurement device 152 and the third power measurement device 153 and may estimate and check the first power amount data of the first power measurement device 151 including a power amount flowing from the external power supply source 110 on the basis of the checked power amount data. That is, although it is described as an example that the first power measurement device 151 is configured at one end of the external power supply source 110, since the power amount data of the first power measurement device 151 is estimated by second power amount data and third power amount data, the first power measurement device 151 may not be included and configured according to a configuration embodiment of the first power measurement device 151.

The control unit 12 may store the checked first power amount data, second power amount data, and third power amount data in the storage unit 13 in operation S450.

FIG. 5 is an operation flowchart when the monitoring server 10 executes a load power monitoring operation according to a third embodiment of the present invention.

Referring to FIG. 5, the monitoring server 10 may collect power amount data from the power measurement devices 151, 152, and 153 through the communication unit 11 in operation S510. In more detail, the monitoring server 10 may collect power amount data measured and obtained by each of the first power measurement device 151 at the output terminal of the external power supply source 110, the second power measurement device 152 at the input terminal of the distribution board 120, and the third power measurement device 153 at the output terminal of the solar electricity generation device 140.

The control unit 12 of the monitoring server 10 may check power amount data of the first power measurement device 151 collected through the communication unit 11 in operation S520. The control unit 12 may check first power amount data including a power amount applied from the external power supply source 110.

When checking the power amount data of the first power measurement device 151, the control unit 12 of the monitoring server 10 may check second power amount data received from the second power measurement device 152 in operation S530. The control unit 12 may check second power amount data including information on the power usage amount pattern and the power consumption amount of the electronic device 130 to which power is supplied through the distribution board 120. At this point, information on a power usage amount pattern may be obtained through an NILM algorithm.

When checking the power amount data of the second power measurement device 152, the control unit 12 of the monitoring server 10 may check third power amount data received from the third power measurement device 153 in operation S540. The control unit 12 may check third power amount data including a power amount generated by the solar electricity generation device 140.

As mentioned above, the control unit 12 may check power amount data including a generation amount or a power consumption amount of each of the first power measurement device 151, the second power measurement device 152, and the third power measurement device 153.

The control unit 12 may store the checked first power amount data, second power amount data, and third power amount data in the storage unit 13 in operation S550.

The control unit 12 may output information on power amount data checked and stored in the storage unit 13 through the output unit 14 at a user's request according to the first, second, and third embodiments.

Figure 6:
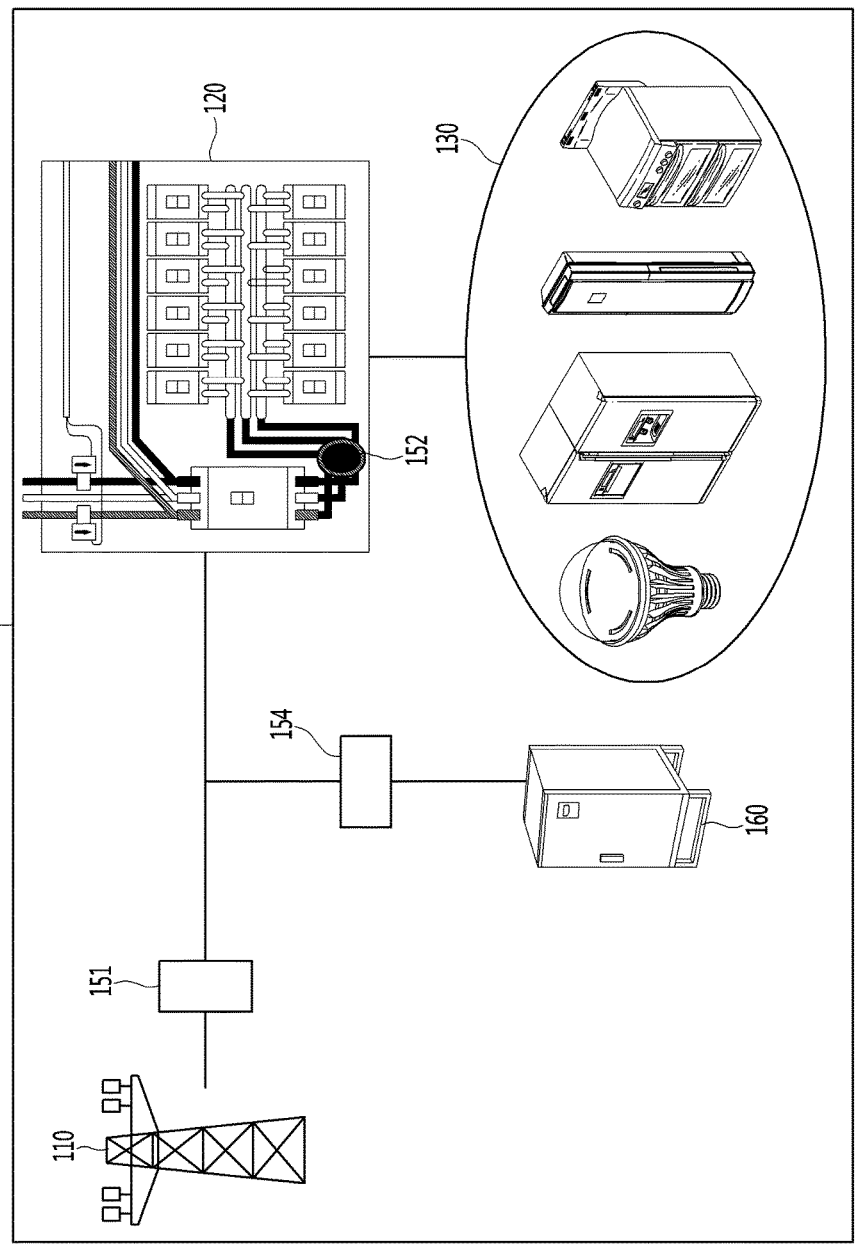
FIG. 6 is a block diagram illustrating a load power monitoring system according to another embodiment of the present disclosure.

FIG. 6 is a block diagram illustrating a load power monitoring system according to another embodiment of the present disclosure.

Referring to FIG. 6, a load power monitoring system according to the other embodiment of the present invention includes a monitoring server 10, an external power supply source 110, a distribution board 120, an electronic device 130, and an energy storage device 160. Especially, output terminals or input terminals of the external power supply source 110, the distribution board 120, and the energy storage device 160 may be configured to include power measurement devices 151, 152, and 154 for detecting power amount data flowing or outputted to the devices.

According to the other embodiment of the present invention, a case that the energy storage device 160 is configured as an example of a renewable energy source is described.

The monitoring server 10 may obtain power amount data including loads measured by the power measurement devices 151, 152, and 154 and the power consumption, inflow rate, or power consumption pattern of a power source. The power of a load may be monitored and outputted based on the obtained data.

Since a configuration of the monitoring server 10 is described with reference to FIG. 14, its detailed description is omitted.

The external power supply source 110, as an external power generation source such as a power plant, may supply power flowing from the external power supply source 110 to various loads including the electronic device 130 in home through the distribution board 120 or may apply power to the energy storage device 160.

The distribution board 120 may distribute power flowing from the external power supply source 110 or the energy storage device 160 to be applied to various loads such as the electronic device 130 in home.

The energy storage device 160 (for example, Electric Energy Storage (EES)) may be a device for storing power flowing from the external power supply source 110 and applying the stored power to the electronic device 130 through the distribution board 120 at a predetermined time point (or a user request time point). For example, power may be stored in the energy storage device 160 at a time slot at which power consumption is less or a power usage charge is low, for example, night time, and the stored power may be discharged at a time slot at which a power demand amount is increased or a power usage charge is high.

One ends of the external power supply source 110, the distribution board 120, and the energy storage device 160 may be configured to connect to the power measurement devices 151, 152, and 154, respectively.

The first power measurement device 151 connected to the one end of the external power supply source 110 may be configured with at least one module for measuring a power amount supplied from the external power supply source 110.

The second power measurement device 152 connected to the one end of the distribution board 120 may be configured with at least one module for measuring a power amount used in a load when supplying, to various loads such as the electronic device 130 in home, the power flowing from the external power supply source 110 or the energy storage device 160. Especially, the second power measurement device 152 may measure the usage pattern of a power amount of a load in addition to the power consumption amount of a load. That is, the second power measurement device 152 may measure power amount data including operating state information and power consumption pattern information on a load in addition to the power consumption amount of a load The fourth power measurement device 154 connected to the one end of the energy storage device 160 may be configured with at least one module for measuring a power amount flowing from the external power supply source 110 and stored and a power amount discharged to the distribution board 120.

A load power monitoring method according to another embodiment of the present invention will be described in detail with reference to FIGS. 7 to 9 on the basis of a configuration of a load power monitoring system including the above power measurement device.

Figure 7:
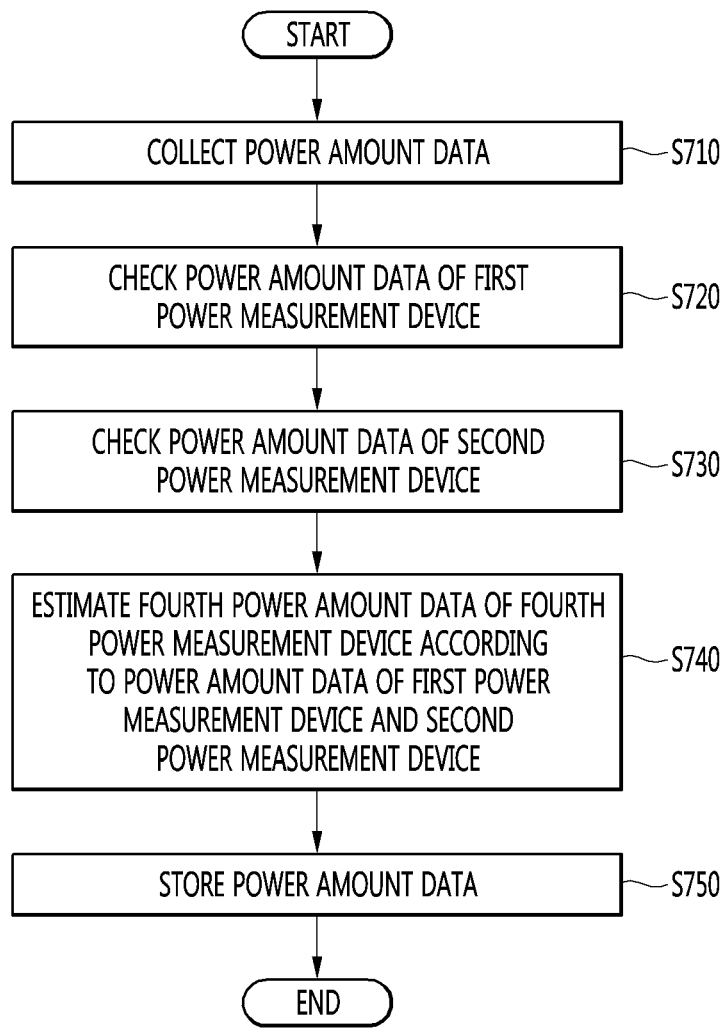
FIGS. 7, 8, and 9 are flowcharts illustrating load power monitoring operations of a load power monitoring system applied according to another embodiment of the present invention.
Figure 8:
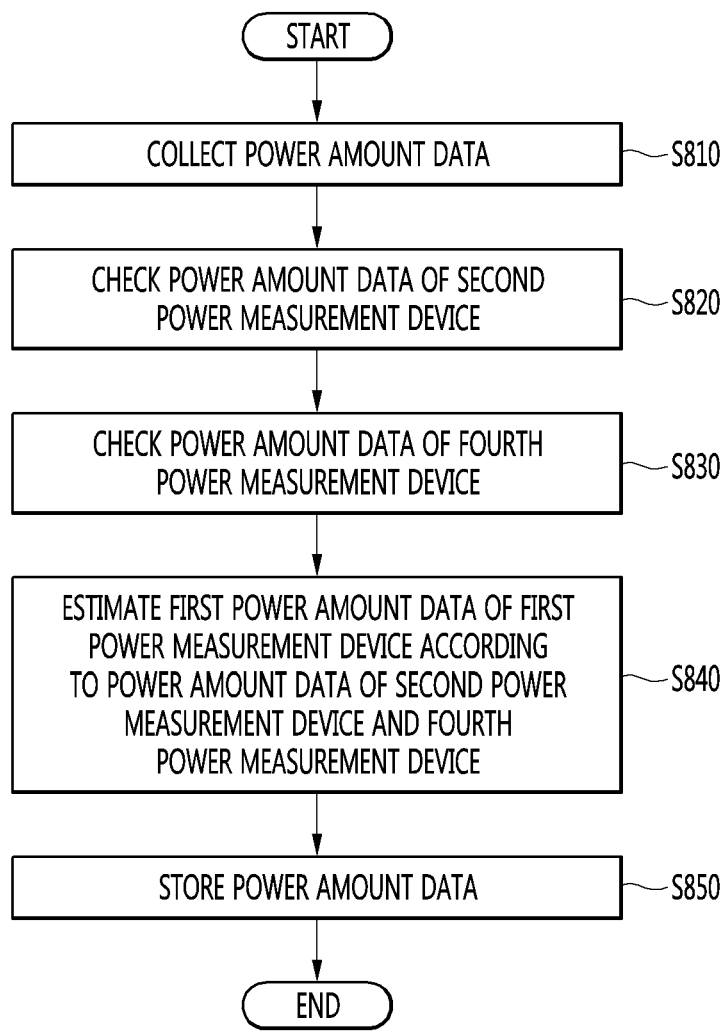
Figure 9:
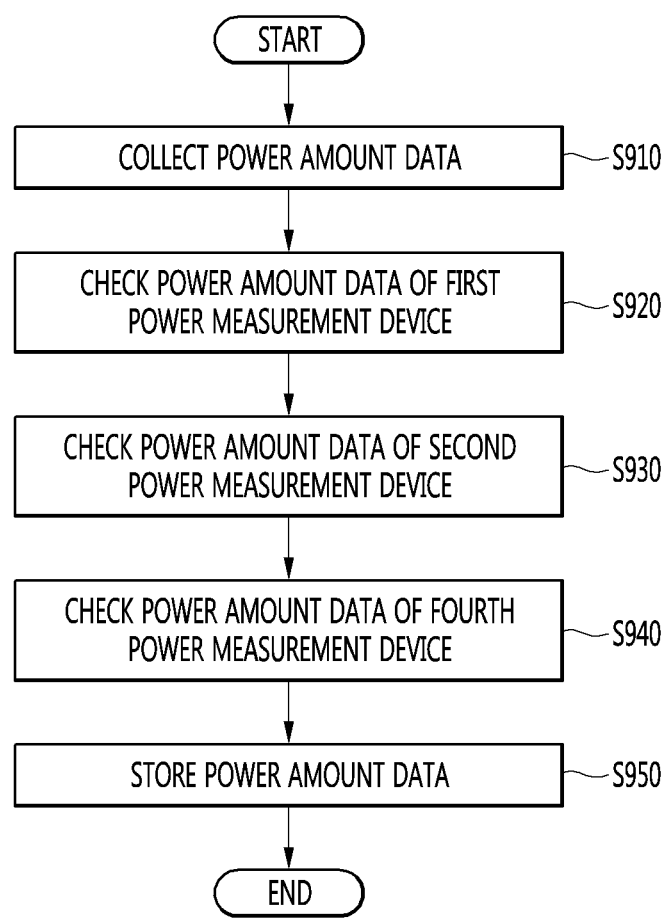

FIGS. 7 to 9 are flowcharts illustrating load power monitoring operations of a load power monitoring system applied according to another embodiment of the present invention.

FIG. 7 is an operation flowchart when the monitoring server 10 executes a load power monitoring operation according to a first embodiment of the present invention.

Referring to FIG. 7, the monitoring server 10 may collect power amount data from the power measurement devices 151, 152, and 154 through the communication unit 11 in operation S710. In more detail, the monitoring server 10 may collect power amount data measured and obtained by each of the first power measurement device 151 at the output terminal of the external power supply source 110, the second power measurement device 152 at the input terminal of the distribution board 120, and the fourth power measurement device 154 at the one end of an energy storage device.

The control unit 12 of the monitoring server 10 may check power amount data of the first power measurement device 151 collected through the communication unit 11 in operation S720. The control unit 12 may check first power amount data including a power amount applied from the external power supply source 110.

When checking the power amount data of the first power measurement device 151, the control unit 12 of the monitoring server 10 may check second power amount data received from the second power measurement device 152 in operation S730. The control unit 12 may check second power amount data including information on the power usage amount pattern and the power consumption amount of the electronic device 130 to which power is supplied through the distribution board 120. At this point, information on a power usage amount pattern may be obtained through an NILM algorithm.

When checking the power amount data of the second power measurement device 152, the control unit 12 of the monitoring server 10 may estimate and check the power amount data of the fourth power measurement device 154 on the basis of the power amount data of the first power measurement device 151 and the second power measurement device 152 in operation S740. In more detail, the control unit 12 may calculate the power amount data of the fourth power measurement device 154 by using a difference (−) of the first power amount data of the first power measurement device 151 and the second power amount data of the second power measurement device 152. That is, when a difference of the power amount (for example, the first power amount data) flowing from the external power supply source 110 and the power amount (for example, the second power amount data) consumed by the electronic device 130 is calculated through the distribution board 120, a power amount (for example, a charging power amount) charged in the energy storage device 160 and a discharged power amount (for example, a discharging power amount) may be calculated.

As mentioned above, the control unit 12 may check power amount data including an inflow power amount and a power consumption amount of each of the first power measurement device 151 and the second power measurement device 152, check the checked power amount data, and estimate and check fourth power amount data including a charging amount and a generation amount for a renewable energy source such as the energy storage device 160 on the basis of the checked power amount data. That is, although it is described as an example that the fourth power measurement device 154 is configured at the one end of the energy storage device 160, since the power amount data of the fourth power measurement device 154 is estimated by first power amount data and second power amount data, the fourth power measurement device 154 may not be included and configured according to a configuration embodiment of a system.

The control unit 120 may store the checked first power amount data, second power amount data, and fourth power amount data in the storage unit 13 in operation S750.

FIG. 8 is an operation flowchart when the monitoring server 10 executes a load power monitoring operation according to a second embodiment of the present invention.

Referring to FIG. 8, the monitoring server 10 may collect power amount data from the power measurement devices 151, 152, and 154 through the communication unit 11 in operation S810. In more detail, the monitoring server 10 may collect power amount data measured and obtained by each of the first power measurement device 151 at the output terminal of the external power supply source 110, the second power measurement device 152 at the input terminal of the distribution board 120, and the fourth power measurement device 154 at the one end of the energy storage device 160.

The control unit 12 of the monitoring server 10 may check second power amount data received from the second power measurement device 152 in operation S810. The control unit 12 may check second power amount data including information on the power usage amount pattern and the power consumption amount of the electronic device 130 to which power is supplied through the distribution board 120. At this point, information on a power usage amount pattern may be obtained through an NILM algorithm.

When checking the power amount data of the second power measurement device 152, the control unit 12 of the monitoring server 10 may check fourth power amount data received from the fourth power measurement device 154 in operation S830. The control unit 12 may check fourth power amount data including a power amount stored in the energy storage device 160 and a discharged power amount.

The control unit 12 of the monitoring server 10 may estimate and check power amount data of the first power measurement device 151 on the basis of the checked power amount data of the second power measurement device 152 and the checked power amount data of the fourth power measurement device 154 in operation S840. In more detail, the control unit 12 may calculate the power amount data of the first power measurement device 151 by using the sum (+) of the fourth power amount data of the fourth power measurement device 154 and the second power amount data of the second power measurement device 152. That is, when the sum of the power amount (for example, the fourth power amount data) stored in the energy storage device 160 and the power amount (for example, the second power amount data) consumed by the electronic device 130 is calculated through the distribution board 120, a power amount (for example, the first power amount data) flowing from the external power supply source 110 may be estimated and checked.

As mentioned above, the control unit 12 may check power amount data including a power consumption amount or a charged/discharged power amount of each of the second power measurement device 152 and the fourth power measurement device 154 and may estimate and check the power amount data of the first power measurement device 151 including a power amount flowing from the external power supply source 110 on the basis of the checked power amount data. That is, although it is described as an example that the first power measurement device 151 is configured at one end of the external power supply source 110, since the power amount data of the first power measurement device 151 is estimated by second power amount data and third power amount data, the first power measurement device 151 may not be included and configured according to a configuration embodiment of the first power measurement device 151.

The control unit 12 may store the checked first power amount data, second power amount data, and fourth power amount data in the storage unit 13 in operation S850.

FIG. 9 is an operation flowchart when the monitoring server 10 executes a load power monitoring operation according to a third embodiment of the present invention.

Referring to FIG. 9, the monitoring server 10 may collect power amount data from the power measurement devices 151, 152, and 154 through the communication unit 11 in operation S910. In more detail, the monitoring server 10 may collect power amount data measured and obtained by each of the first power measurement device 151 at the output terminal of the external power supply source 110, the second power measurement device 152 at the input terminal of the distribution board 120, and the fourth power measurement device 154 at the one end of the energy storage device 160.

The control unit 12 of the monitoring server 10 may check power amount data of the first power measurement device 151 collected through the communication unit 11 in operation S920.

When checking the power amount data of the first power measurement device 151, the control unit 12 of the monitoring server 10 may check second power amount data received from the second power measurement device 152 in operation S930. The control unit 12 may check second power amount data including information on the power usage amount pattern and the power consumption amount of the electronic device 130 to which power is supplied through the distribution board 120. At this point, information on a power usage amount pattern may be obtained through an NILM algorithm.

When checking the power amount data of the second power measurement device 152, the control unit 12 of the monitoring server 10 may check fourth power amount data received from the fourth power measurement device 154 in operation S940. The control unit 12 may check fourth power amount data including a power amount stored in the energy storage device 160 and a discharged power amount.

As mentioned above, the control unit 12 may check power amount data including a generation amount or a power consumption amount and a charging/discharging power amount of each of the first power measurement device 151, the second power measurement device 152, and the fourth power measurement device 154.

The control unit 12 may store the checked first power amount data, second power amount data, and fourth power amount data in the storage unit 13 in operation S950.

The control unit 12 may output information on power amount data checked and stored in the storage unit 13 through the output unit 14 at a user's request according to the first, second, and third embodiments.

Figure 10:
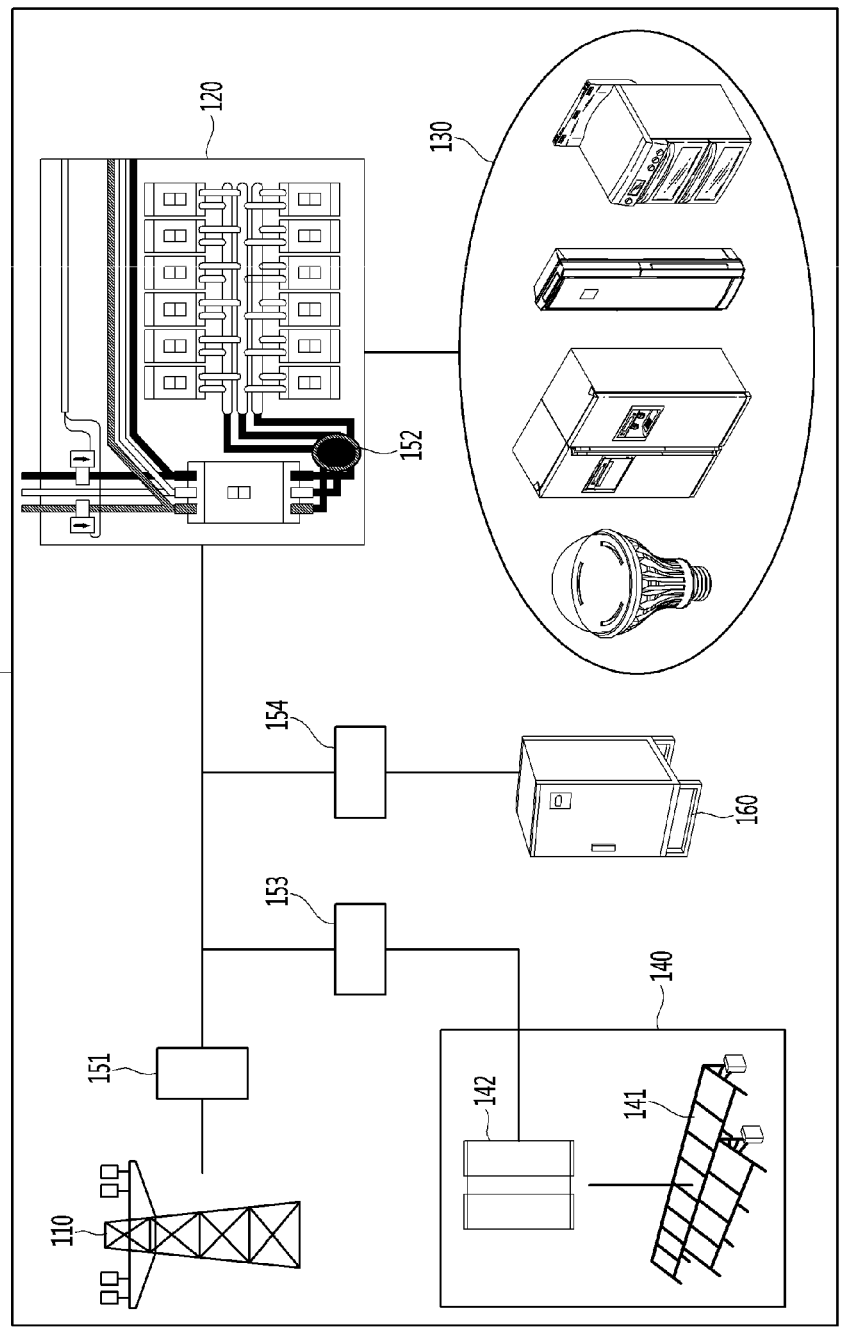
FIG. 10 is a block diagram illustrating a load power monitoring system according to another embodiment of the present disclosure.

FIG. 10 is a block diagram illustrating a load power monitoring system according to another embodiment of the present disclosure.

Referring to FIG. 10, a load power monitoring system according to the other embodiment of the present invention includes a monitoring server 10, an external power supply source 110, a distribution board 120, an electronic device 130, a solar electricity generation device 140, and an energy storage device 160. Especially, one ends of the external power supply source 110, the distribution board 120, the solar electricity generation device 140, and the energy storage device 160 may be configured to include power measurement devices 151, 152, 153, and 154 for detecting power amount data inflowing or outputted to the devices.

According to the other embodiment of the present invention, when the solar electricity generation device 140 and the energy storage device 160 are configured together as an example of a renewable energy source, a configuration in which a plurality of renewable energy sources are connected is described.

The monitoring server 10 may obtain power amount data including loads measured by the power measurement devices 151, 152, 153, and 154 and the power consumption amount, inflow rate, charging/discharging amount, and power consumption pattern of a power source. The power of a load may be monitored and outputted based on the obtained data.

Since a configuration of the monitoring server 10 is described with reference to FIG. 14, its detailed description is omitted.

The external power supply source 110, as an external power generation source such as a power plant, may supply power flowing from the external power supply source 110 to various loads including the electronic device 130 in home through the distribution board 120 or may apply power to the energy storage device 160.

The distribution board 120 may distribute power flowing from the external power supply source 110, the solar electricity generation device 140, or the energy storage device 160 to be applied to various loads such as the electronic device 130 in home.

The solar electricity generation device 140 may be configured to include a solar module 141 and a control module 142. Solar energy incident to the solar module 141 of the solar electricity generation device 140 may be converted into AC power through the control module 140 and supplied to the distribution board 120.

The energy storage device 160 (for example, Electric Energy Storage (EES)) may be a device for storing power flowing from the external power supply source 110 and applying the stored power to the electronic device 130 through the distribution board 120 at a predetermined time point (or a user request time point). For example, power may be stored in the energy storage device 160 at a time slot at which power consumption is less or a power usage charge is low, for example, night time, and the stored power may be discharged at a time slot at which a power demand amount is increased or a power usage charge is high.

One ends of the external power supply source 110, the distribution board 120, the solar electricity generation device 140, and the energy storage device 160 may be configured to connect to the power measurement devices 151, 152, 153, and 154, respectively.

The first power measurement device 151 connected to the one end of the external power supply source 110 may be configured with at least one module for measuring a power amount supplied from the external power supply source 110.

The second power measurement device 152 connected to the one end of the distribution board 120 may be configured with at least one module for measuring a power amount used in a load when supplying, to various loads such as the electronic device 130 in home, the power flowing from the external power supply source 110, the solar electricity generation device 140, or the energy storage device 160. Especially, the second power measurement device 152 may measure the usage pattern of a power amount of a load in addition to the power consumption amount of a load. That is, the second power measurement device 152 may measure power amount data including operating state information and power consumption pattern information on a load in addition to the power consumption amount of a load The third power measurement device 153 connected to the output terminal of the solar electricity generation device 140 may be configured with at least one module for measuring a power amount generated by the solar electricity generation device 140.

The fourth power measurement device 154 connected to the one end of the energy storage device 160 may be configured with at least one module for measuring a power amount flowing from the external power supply source 110 and stored and a power amount discharged to the distribution board 120.

A load power monitoring method according to another embodiment of the present invention will be described in detail with reference to FIGS. 11 to 13 on the basis of a configuration of a load power monitoring system including the above power measurement device.

Figure 11:
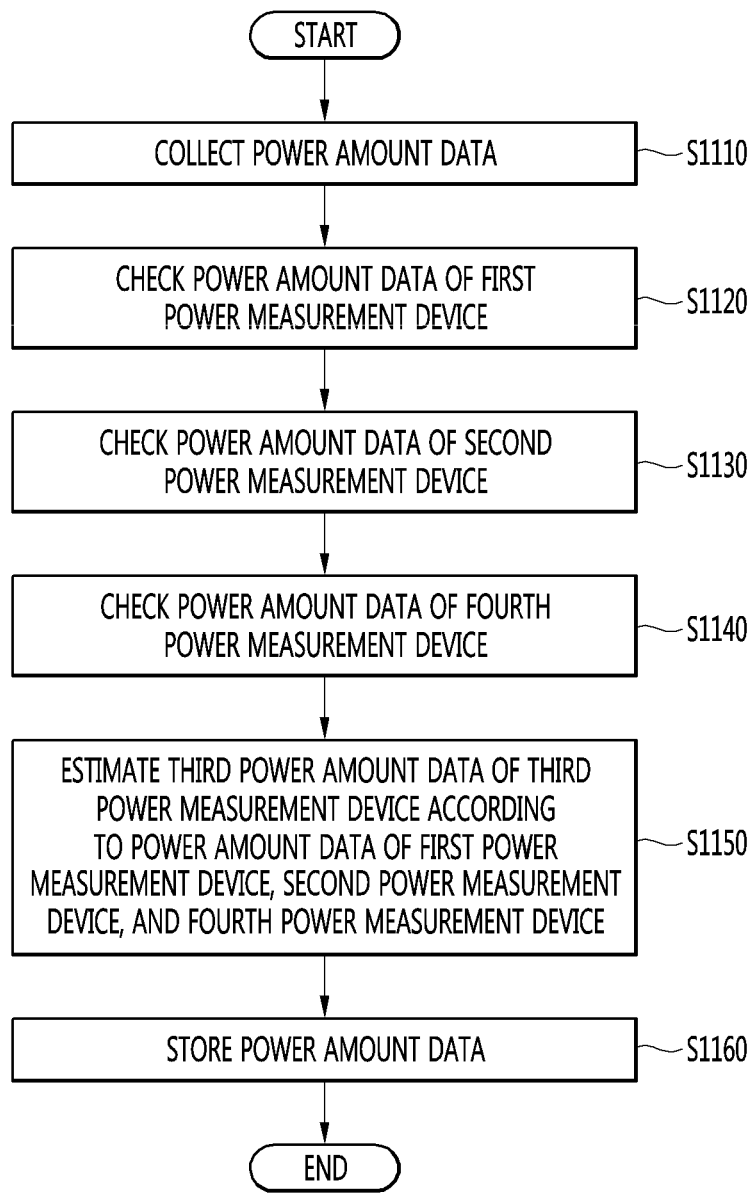
FIGS. 11, 12, and 13 are flowcharts illustrating load power monitoring operations of a load power monitoring system applied according to another embodiment of the present invention.
Figure 12:
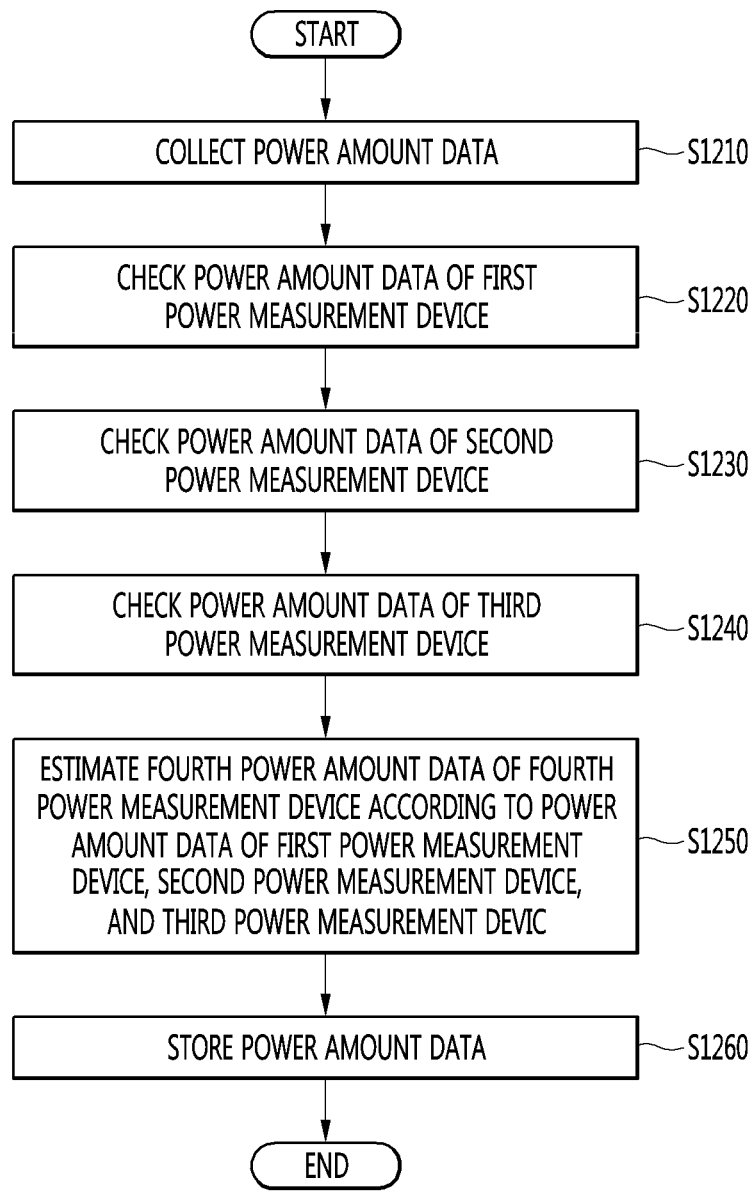
Figure 13:
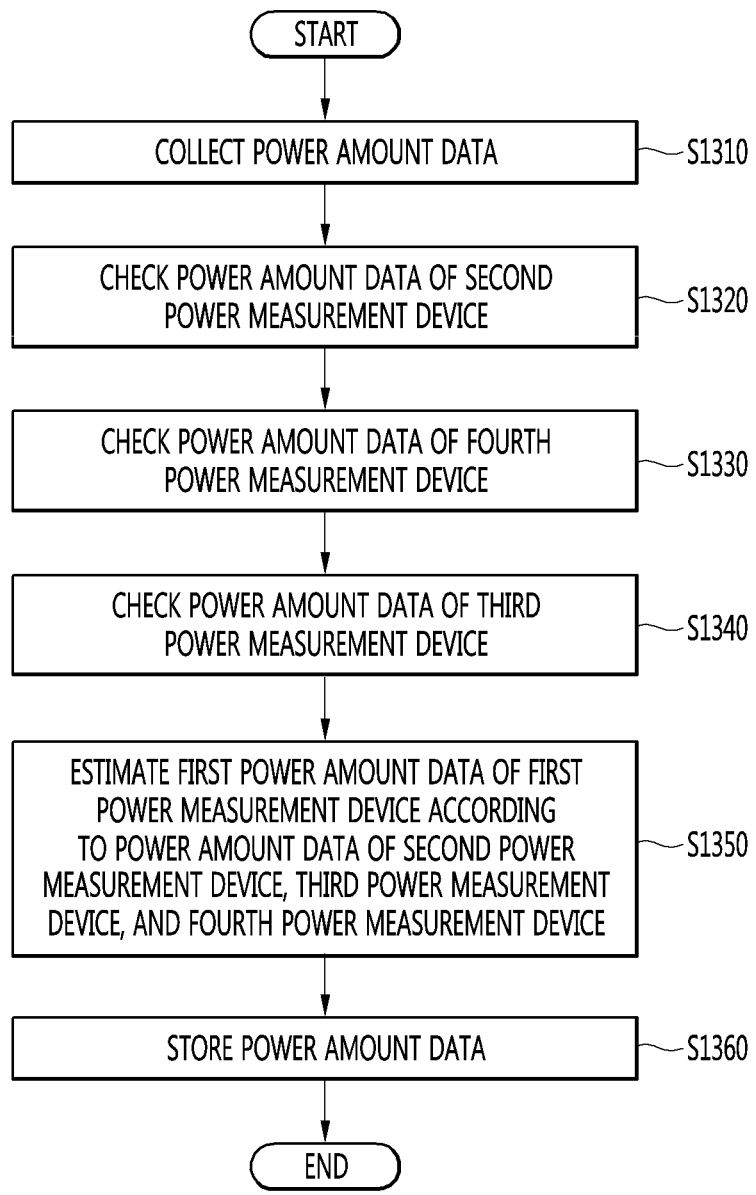

FIGS. 11 to 13 are flowcharts illustrating load power monitoring operations of a load power monitoring system applied according to another embodiment of the present invention.

FIG. 11 is an operation flowchart when the monitoring server 10 executes a load power monitoring operation according to a first embodiment of the present invention.

Referring to FIG. 11, the monitoring server 10 may collect power amount data from the power measurement devices 151, 152, 153, and 154 through the communication unit 11 in operation S1110. In more detail, the monitoring server 10 may collect power amount data measured and obtained by each of the first power measurement device 151 at the output terminal of the external power supply source 110, the second power measurement device 152 at the input terminal of the distribution board 120, the third power measurement device 153 at the output terminal of the solar electricity generation device 153, and the fourth power measurement device 154 at the one end of an energy storage device.

The control unit 12 of the monitoring server 10 may check power amount data of the first power measurement device 151 collected through the communication unit 11 in operation S1120. The control unit 12 may check first power amount data including a power amount applied from the external power supply source 110.

When checking the power amount data of the first power measurement device 151, the control unit 12 of the monitoring server 10 may check second power amount data received from the second power measurement device 152 in operation S1130. The control unit 12 may check second power amount data including information on the power usage amount pattern and the power consumption amount of the electronic device 130 to which power is supplied through the distribution board 120. At this point, information on a power usage amount pattern may be obtained through an NILM algorithm.

When checking the power amount data of the second power measurement device 152, the control unit 12 of the monitoring server 10 may check fourth power amount data received from the fourth power measurement device 154 in operation S1140. The control unit 12 may check fourth power amount data including a power amount charged in the energy storage device 160 and a discharged power amount applied to the electronic device 130 through the distribution board 120.

The control unit 12 of the monitoring server 10 may estimate and check the power amount data of the third power measurement device 153 on the basis of the power amount data of the first power measurement device 151, the second power measurement device 152, and the fourth power measurement device 154 in operation S1150. In more detail, the control unit 12 may estimate and check a power amount (for example, the third power amount data) generated by the solar electricity generation device 140, which is measured by the third power measurement device 153, as subtracting (−) the first power amount data of the first power measurement device 151 from the sum (+) of the fourth power amount data of the fourth power measurement device 154 and the second power amount data of the second power measurement device 152.

As mentioned above, the control unit 12 may check power amount data of the first power measurement device 151, the second power measurement device 152, and the fourth power measurement device 154 and may estimate and check third power amount data of the third power measurement device 153 including a power amount generated by the solar electricity generation device 140 on the basis of the checked power amount data. That is, although it is described as an example that the third power measurement device 153 is configured at the one end of the solar electricity generation device 140, since the power amount data of the third power measurement device 153 is estimated by first power amount data, second power amount data, and fourth power amount data, the third power measurement device 153 may not be included and configured according to a configuration embodiment of a system.

The control unit 12 may store the checked first power amount data, second power amount data, third power amount data, and fourth power amount data in the storage unit 13 in operation S1160.

FIG. 12 is an operation flowchart when the monitoring server 10 executes a load power monitoring operation according to a second embodiment of the present invention.

Referring to FIG. 12, the monitoring server 10 may collect power amount data from the power measurement devices 151, 152, 153, and 154 through the communication unit 11 in operation S1210. In more detail, the monitoring server 10 may collect power amount data measured and obtained by each of the first power measurement device 151 at the output terminal of the external power supply source 110, the second power measurement device 152 at the input terminal of the distribution board 120, the third power measurement device 153 at the output terminal of the solar electricity generation device 153, and the fourth power measurement device 154 at the one end of an energy storage device.

The control unit 12 of the monitoring server 10 may check power amount data of the first power measurement device 151 collected through the communication unit 11 in operation S1220. The control unit 12 may check first power amount data including a power amount applied from the external power supply source 110.

When checking the power amount data of the first power measurement device 151, the control unit 12 of the monitoring server 10 may check second power amount data received from the second power measurement device 152 in operation S1230. The control unit 12 may check second power amount data including information on the power usage amount pattern and the power consumption amount of the electronic device 130 to which power is supplied through the distribution board 120. At this point, information on a power usage amount pattern may be obtained through an NILM algorithm.

The control unit 12 of the monitoring server 10 may estimate and check the power amount data of the fourth power measurement device 154 on the basis of the power amount data of the first power measurement device 151, the second power measurement device 152, and the third power measurement device 154 in operation S1240. In more detail, the control unit 12 may estimate and check a power charging amount and a discharging amount (for example, the fourth power amount data) checked by the fourth power measurement device 154 by subtracting (−) the second power amount data of the second power measurement device 152 from the sum (+) of the first power amount data of the first power measurement device 151 and the third power amount data of the third power measurement device 153. At this point, if the sum (+) of the first power amount and the third power amount exceeds the second power amount data, this may define charged power mount data and if the sum (+) of the first power amount data and the third power amount data is less than the second power amount data, this may define discharged power amount data.

When checking the fourth power amount data, the control unit 12 of the monitoring server 10 may check third power amount data received from the third power measurement device 153 in operation S1250. The control unit 12 may check third power amount data including a power amount generated by the solar electricity generation device 140.

As mentioned above, the control unit 12 may check power amount data of the first power measurement device 151, the second power measurement device 152, and the third power measurement device 153 and may estimate and check a power amount (for example, the fourth power amount data) charged in or discharged from the energy storage device 160 on the basis of the checked power amount data. That is, although it is described as an example that the fourth power measurement device 154 is configured at the one end of the energy storage device 160, since the power amount data of the fourth power measurement device 154 is estimated by first power amount data, second power amount data, and third power amount data, the fourth power measurement device 154 may not be included and configured according to a configuration embodiment of a system.

The control unit 12 may store the checked first power amount data, second power amount data, third power amount data, and fourth power amount data in the storage unit 13 in operation S1260.

FIG. 13 is an operation flowchart when the monitoring server 10 executes a load power monitoring operation according to a third embodiment of the present invention.

Referring to FIG. 13, the monitoring server 10 may collect power amount data from the power measurement devices 151, 152, 153, and 154 through the communication unit 11 in operation S1310. In more detail, the monitoring server 10 may collect power amount data measured and obtained by each of the first power measurement device 151 at the output terminal of the external power supply source 110, the second power measurement device 152 at the input terminal of the distribution board 120, the third power measurement device 140 at the output terminal of the solar electricity generation device 153, and the fourth power measurement device 154 at the one end of an energy storage device.

The control unit 12 of the monitoring server 10 may check second power amount data received from the second power measurement device 152 in operation S1320. The control unit 12 may check second power amount data including information on the power usage amount pattern and the power consumption amount of the electronic device 130 to which power is supplied through the distribution board 120. At this point, information on a power usage amount pattern may be obtained through an NILM algorithm.

When checking the power amount data of the second power measurement device 152, the control unit 12 of the monitoring server 10 may check fourth power amount data received from the fourth power measurement device 154 in operation S1330. The control unit 12 may check fourth power amount data including a power amount stored in the energy storage device 160 and a discharged power amount.

When checking the power amount data of the fourth power measurement device 154, the control unit 12 of the monitoring server 10 may check third power amount data received from the third power measurement device 153 in operation S1340. The control unit 12 may check third power amount data including a power amount generated by the solar electricity generation device 140.

The control unit 12 of the monitoring server 10 may estimate and check the power amount data of the first power measurement device 151 on the basis of the checked power amount data of the second power measurement device 152, the third power measurement device 153, and the fourth power measurement device 154 in operation S1350. In more detail, the control unit 12 may estimate and check first power amount data including a power amount flowing from the external power supply source 110, which is measured by the first power measurement device 151, as subtracting (−) the third power amount data of the third power measurement device 153 from the sum (+) of the second power amount data of the second power measurement device 152 and the fourth power amount data of the fourth power measurement device 154.

As mentioned above, the control unit 12 may check power amount data of the second power measurement device 152, the third power measurement device 153, and the fourth power measurement device 154 and may estimate and check a power amount (for example, the first power amount data) of the external power supply source 110 on the basis of the checked power amount data. That is, although it is described as an example that the first power measurement device 151 is configured at one end of the external power supply source 110, since the power amount data of the first power measurement device 151 is estimated by second power amount data, third power amount data, and fourth power amount data, the first power measurement device 151 may not be included and configured according to a configuration embodiment of the first power measurement device 151.

The control unit 12 may store the checked first power amount data, second power amount data, third power amount data, and fourth power amount data in the storage unit 13 in operation S1360.

Figure 15:
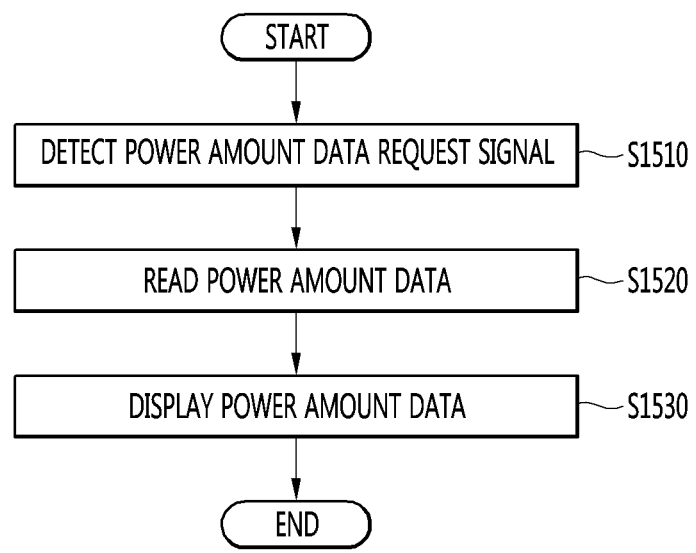
FIG. 15 is a flowchart illustrating operations for outputting a load power monitoring result according to an embodiment of the present invention.
Figure 16:
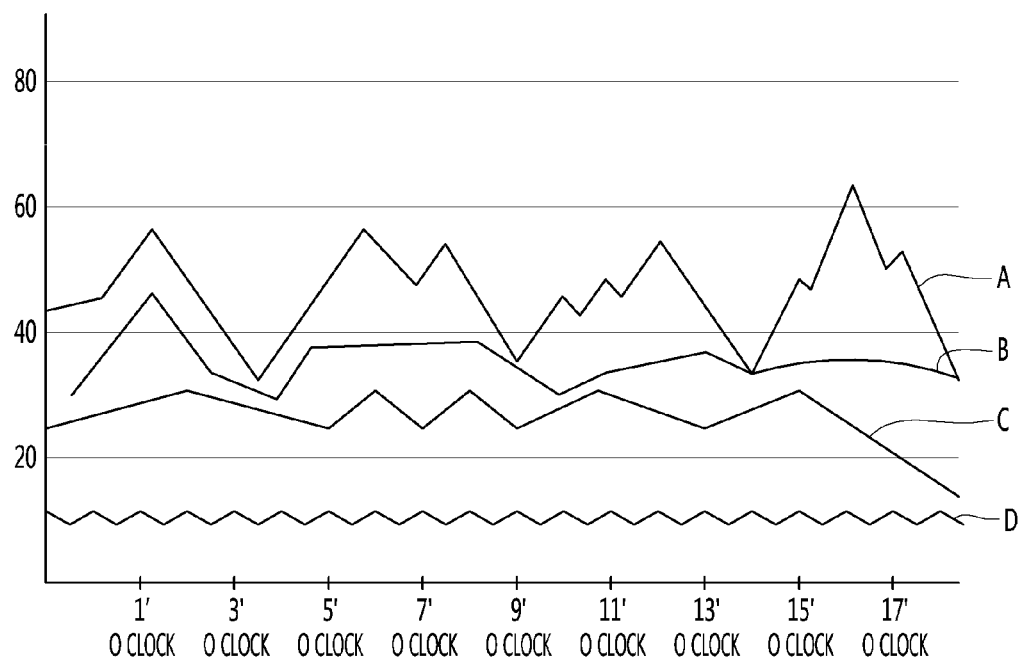
FIG. 16 is a view illustrating a load power monitoring result output according to an embodiment of the present invention.

FIG. 15 is a flowchart illustrating operations for outputting a load power monitoring result according to an embodiment of the present invention. FIG. 16 is a view illustrating a load power monitoring result output according to an embodiment of the present invention.

Referring to FIGS. 15 and 16, operations for outputting a low power monitoring result stored in the storage unit 13 of the monitoring server 10 are described in detail according to an embodiment of the present invention.

Referring to FIGS. 15 and 16, the control unit 12 of the monitoring server 10 may detect an output request signal of power amount data measured and obtained and then stored in the storage unit 13 according to an embodiment, another embodiment, or further another embodiment in operation S1510. The output request signal may be inputted through a user input unit (not shown) or may be received wiredly/wirelessly from a remote terminal.

The control unit 12 of the monitoring server 10 may extract power amount data stored in the storage unit 13 in operation S1520 and may display the power amount data in various aspects such as graphs, numbers, and texts as shown in FIG. 16 in operation S1530. FIG. 16 is a view illustrating information on a power consumption amount or a charging amount of an electronic device and a renewable energy source. For example, A to C represent power amount data of the electronic devices and D represents power amount data of renewable energy sources 140 and 160. In the case of power amount data of electronic devices, as data required for the NILM analysis is detected, a period of power amount data may be short.

Although operations for measuring or estimating power amount data by each of the external power supply source 110, the electronic device 130 connected to the distribution board 120, the solar electricity generation device 140, and the energy storage device 160 are described sequentially according to the embodiments of the present invention, the operation order for estimating or measuring the power amount data is not limited and may be changed in various forms and executed.

As mentioned above, a power measurement device and a low power monitoring system using the same and an operating method thereof according to embodiments of the present invention configure a highly reliable and high performance system with minimum costs and execute a load power amount according thereto effectively.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A load power monitoring system comprising:
an external power supply source;
a renewable energy source;
a distribution board including an input terminal electrically connected to the external power supply source and the renewable energy source and an output terminal electrically connected to a plurality of electronic devices;
a first power measurement device installed on a first device of the external power supply source, the renewable energy source and the distribution board and configured to obtain first power information of the first device;
a second power measurement device installed a second device of the external power supply source, the renewable energy source and the distribution board and configured to obtain second power information of the second device; and
a monitoring server configured to estimate third power information of a device on which no power measurement device is installed and to monitor power of the plurality of electronic devices,
wherein the third power information is estimated based on the obtained first and second power, and
wherein the power of the plurality of electronic devices is monitored based on the obtained first and second power information and the estimated third power information.

2. The system according to claim 1, wherein the renewable energy source is at least a solar electricity generation device or an energy storage device.

3. The system according to claim 2, wherein the solar electricity generation device includes a solar module and a control module configured to convert energy of the solar module into power when the renewable enemy source is the solar electricity generation device.

4. The system according to claim 3, further comprising a third power measurement device connected to one end of the solar electricity generation device and configured to detect fourth power information that includes an amount of generated electricity and an amount of power output by the solar electricity generation device.

5. The system according to claim 2, wherein the energy storage device is charged with power from the external power supply source and discharges power to an electronic device connected to the distribution board when the renewable energy source is the energy storage device.

6. The system according to claim 5, further comprising a third power measurement device connected to one end of the energy storage device and configured to detect fourth power information that includes the amount of power from the external power supply source and the amount of power discharged by the energy storage device.

7. The system according to claim 1, wherein the second power information includes an amount of power applied to the plurality of electronic devices and a power consumption pattern of the plurality of electronic devices.

8. The system according to claim 7, wherein the power consumption pattern is obtained via a Non-intrusive Load Monitoring (NILM) algorithm.

9. The system according to claim 1, wherein the server comprises:
a communication unit configured to collect power information from the power measurement devices;
a control unit configured to obtain the collected power information;
a storage unit configured to store the obtained power information; and
an output unit configured to output the stored power information.

10. The system according to claim 9, wherein the control unit is further configured to estimate and obtain at least one of the first and second power information based on at least two of the collected power information.

11. A method of monitoring power loads, the method comprising:
obtaining first power information from a first device of an external power supply source, a renewable enemy source and a distribution board;
obtaining second power information from second device of the external power supply source, the renewable energy source and the distribution board;
estimating third power information of a device on which no power measurement device is installed; and
monitoring power of ea plurality of electronic devices,
wherein the third power information is estimated based on the obtained first and second power information, and
wherein the power of the plurality of electronic devices is monitored based on the obtained first and second power information and the estimated third power information.

12. The method according to claim 11, wherein the second power information includes an amount of power applied to the plurality of electronic devices and an amount of power consumed in the plurality of electronic devices.

13. The method according to claim 12, wherein amount of power applied to the plurality of electronic devices includes a power consumption pattern of the plurality of electronic devices.

14. The method according to claim 11, wherein power information of the renewable energy source is estimated based on addition and subtraction of the first power information and the second power information.

15. The method according to claim 11, wherein power information of the renewable energy source is estimated based on a difference between the first power information and the second power information.

16. The method according to claim 15, wherein the first and second power information is estimated based on a power charging amount or a power discharging amount when the renewable energy source is the energy storage device.

17. The method according to claim 11, wherein the first power information is estimated based on a sum of the second power information and power information of the renewable energy source.

18. The method according to claim 11, wherein the first power information is estimated based on a difference between a sum of the second power information and power information of a plurality of renewable energy sources.

19. The method according to claim 11, wherein power amount information of a second of a plurality of renewable energy sources is estimated based on a difference between a first power amount energy and a sum of a first power amount energy and a power amount energy of a first of the plurality of renewable energy sources.

20. The method according to claim 19, wherein:
the renewable energy source includes an enemy storage device; and
power amount information of the energy storage device includes amounts of power charged and discharged.

* * * * *